United States Patent
Holec et al.

(10) Patent No.: US 8,968,006 B1
(45) Date of Patent: Mar. 3, 2015

(54) CIRCUIT BOARD HAVING A PLATED THROUGH HOLE PASSING THROUGH CONDUCTIVE PADS ON TOP AND BOTTOM SIDES OF THE BOARD AND THE BOARD

(71) Applicant: Metrospec Technology, L.L.C., Mendota Heights, MN (US)

(72) Inventors: Henry V. Holec, Mendota Heights, MN (US); Wm. Todd Crandell, Minnetonka, MN (US)

(73) Assignee: Metrospec Technology, LLC, Mendota Heights, MN (US)

( * ) Notice: Subject to any disclaimer, the term of this patent is extended or adjusted under 35 U.S.C. 154(b) by 0 days.

(21) Appl. No.: 13/944,610

(22) Filed: Jul. 17, 2013

Related U.S. Application Data

(60) Division of application No. 13/190,639, filed on Jul. 26, 2011, now Pat. No. 8,500,456, which is a continuation of application No. 12/406,761, filed on Mar. 18, 2009, now Pat. No. 8,007,286.

(60) Provisional application No. 61/037,595, filed on Mar. 18, 2008, provisional application No. 61/043,006, filed on Apr. 7, 2008.

(51) Int. Cl.
*H01R 12/00* (2006.01)
*H05K 1/14* (2006.01)
(Continued)

(52) U.S. Cl.
CPC ............... *H05K 1/14* (2013.01); *H05K 1/0292* (2013.01); *H05K 1/11* (2013.01)
USPC .......................................................... 439/65

(58) Field of Classification Search
USPC ........................................ 439/63–67, 74, 591
See application file for complete search history.

(56) References Cited

U.S. PATENT DOCUMENTS

| | | |
|---|---|---|
| 2,697,811 A | 12/1954 | Deming |
| 2,731,609 A | 1/1956 | Sobell, III |
| 3,086,189 A | 4/1963 | Robbins |

(Continued)

FOREIGN PATENT DOCUMENTS

| | | |
|---|---|---|
| CN | 201242082 | 5/2009 |
| CN | 201731316 | 2/2011 |

(Continued)

OTHER PUBLICATIONS

"Product Information Bulletin DRAGONtape", Osram Sylvania, 2007, 2 pages 2007, 1-2.

(Continued)

*Primary Examiner* — Chandrika Prasad
(74) *Attorney, Agent, or Firm* — Pauly, Devries Smith & Deffner, LLC

(57) ABSTRACT

In some embodiments, an interconnectable circuit board may include one or more of the following features: (a) a first electrically conductive pad located on a top of the circuit board, (b) a plated through hole on the conductive pad which passes through the circuit board, (c) a second electrically conductive pad coupled to the plated through hole; the second conductive pad capable of being electrically connected to a third electrically conductive pad attached to a top of a second interconnectable circuit board, (d) cut marks indicating safe locations for separating the circuit board, and (e) a second cut mark adjacent to the first cut mark where the area between the first and second cut mark can be utilized to make a safe cut through the circuit board.

20 Claims, 13 Drawing Sheets

(51) Int. Cl.
*H05K 1/02* (2006.01)
*H05K 1/11* (2006.01)

(56) References Cited

U.S. PATENT DOCUMENTS

| | | | |
|---|---|---|---|
| 3,270,251 A | 8/1966 | Evans | |
| 3,401,369 A | 9/1968 | Plamateer, et al. | |
| 4,173,035 A | 10/1979 | Hoyt | |
| 4,250,536 A | 2/1981 | Barringer et al. | |
| 4,285,780 A * | 8/1981 | Schachter | 205/120 |
| 4,515,304 A | 5/1985 | Berger | |
| 4,526,432 A | 7/1985 | Cronin et al. | |
| 4,533,188 A | 8/1985 | Miniet | |
| 4,618,194 A | 10/1986 | Kwilos | |
| 4,685,210 A * | 8/1987 | King et al. | 29/830 |
| 4,761,881 A | 8/1988 | Bora et al. | |
| 4,795,079 A | 1/1989 | Yamada | |
| 4,842,184 A | 6/1989 | Miller, Jr. | |
| 4,871,315 A | 10/1989 | Noschese | |
| 4,950,527 A | 8/1990 | Yamada | |
| 4,991,290 A | 2/1991 | MacKay | |
| 5,001,605 A | 3/1991 | Savagian et al. | |
| 5,041,003 A | 8/1991 | Smith et al. | |
| 5,155,904 A | 10/1992 | Majd | |
| 5,176,255 A | 1/1993 | Seidler | |
| 5,224,023 A | 6/1993 | Smith et al. | |
| 5,375,044 A | 12/1994 | Guritz | |
| 5,404,044 A | 4/1995 | Booth et al. | |
| 5,440,454 A | 8/1995 | Hashimoto et al. | |
| 5,478,008 A | 12/1995 | Takahashi | |
| 5,511,719 A | 4/1996 | Miyake et al. | |
| 5,575,554 A | 11/1996 | Guritz | |
| 5,920,465 A | 7/1999 | Tanaka | |
| 6,089,442 A | 7/2000 | Ouchi et al. | |
| 6,095,405 A | 8/2000 | Kim et al. | |
| 6,100,475 A | 8/2000 | Degani et al. | |
| 6,113,248 A | 9/2000 | Mistopoulos et al. | |
| 6,137,816 A | 10/2000 | Kinbara | |
| 6,199,273 B1 | 3/2001 | Kubo et al. | |
| 6,239,716 B1 | 5/2001 | Pross et al. | |
| 6,299,337 B1 | 10/2001 | Bachl et al. | |
| 6,310,445 B1 | 10/2001 | Kashaninejad | |
| 6,372,997 B1 | 4/2002 | Hill et al. | |
| 6,384,339 B1 | 5/2002 | Neuman | |
| 6,428,189 B1 | 8/2002 | Hochstein | |
| 6,429,383 B1 * | 8/2002 | Sprietsma et al. | 174/260 |
| 6,449,836 B1 | 9/2002 | Miyake et al. | |
| 6,481,874 B2 | 11/2002 | Petroski | |
| 6,517,218 B2 | 2/2003 | Hochstein | |
| 6,578,986 B2 | 6/2003 | Swaris et al. | |
| 6,580,228 B1 | 6/2003 | Chen et al. | |
| 6,589,594 B1 | 7/2003 | Hembree | |
| 6,601,292 B2 | 8/2003 | Li et al. | |
| 6,657,297 B1 | 12/2003 | Jewram et al. | |
| 6,729,888 B2 | 5/2004 | Imaeda | |
| 6,746,885 B2 | 6/2004 | Cao | |
| 6,784,027 B2 | 8/2004 | Streubel | |
| 6,833,526 B2 | 12/2004 | Sinkunas et al. | |
| 6,846,094 B2 | 1/2005 | Luk | |
| 6,851,831 B2 | 2/2005 | Karlicek, Jr. et al. | |
| 6,897,622 B2 | 5/2005 | Lister | |
| 6,898,084 B2 | 5/2005 | Misra | |
| 6,902,099 B2 | 6/2005 | Motonishi et al. | |
| 6,919,529 B2 | 7/2005 | Franzen et al. | |
| 6,936,855 B1 | 8/2005 | Harrah | |
| 6,963,175 B2 | 11/2005 | Archenhold et al. | |
| 6,966,674 B2 | 11/2005 | Tsai | |
| 6,991,473 B1 | 1/2006 | Balcome et al. | |
| 6,996,674 B2 | 2/2006 | Chiu et al. | |
| 7,023,147 B2 | 4/2006 | Colby et al. | |
| 7,037,114 B1 | 5/2006 | Eiger et al. | |
| 7,086,756 B2 | 8/2006 | Maxik | |
| 7,086,767 B2 | 8/2006 | Sidwell et al. | |
| 7,114,831 B2 | 10/2006 | Popovich et al. | |
| 7,114,837 B2 | 10/2006 | Yagi et al. | |
| 7,149,097 B1 | 12/2006 | Shteynberg et al. | |
| 7,199,309 B2 * | 4/2007 | Chamberlin et al. | 174/265 |
| 7,204,615 B2 | 4/2007 | Arik et al. | |
| 7,210,818 B2 | 5/2007 | Luk et al. | |
| 7,253,449 B2 | 8/2007 | Wu | |
| 7,256,554 B2 | 8/2007 | Lys | |
| 7,262,438 B2 | 8/2007 | Mok et al. | |
| 7,263,769 B2 | 9/2007 | Morimoto et al. | |
| 7,276,861 B1 | 10/2007 | Shteynberg et al. | |
| 7,284,882 B2 | 10/2007 | Burkholder | |
| 7,325,955 B2 | 2/2008 | Lucas et al. | |
| 7,331,796 B2 | 2/2008 | Hougham et al. | |
| 7,344,279 B2 | 3/2008 | Mueller et al. | |
| 7,377,669 B2 | 5/2008 | Farmer et al. | |
| 7,377,787 B1 | 5/2008 | Eriksson | |
| 7,394,027 B2 | 7/2008 | Kaluzni et al. | |
| 7,397,068 B2 | 7/2008 | Park et al. | |
| 7,448,923 B2 | 11/2008 | Uka | |
| 7,459,864 B2 | 12/2008 | Lys | |
| 7,497,695 B2 | 3/2009 | Uchida et al. | |
| 7,502,846 B2 | 3/2009 | Mccall et al. | |
| 7,514,880 B2 | 4/2009 | Huang et al. | |
| 7,543,961 B2 | 6/2009 | Arik et al. | |
| 7,547,124 B2 | 6/2009 | Chang et al. | |
| 7,550,930 B2 | 6/2009 | Cristoni et al. | |
| 7,553,051 B2 | 6/2009 | Brass et al. | |
| 7,556,405 B2 | 7/2009 | Kingsford et al. | |
| 7,556,406 B2 | 7/2009 | Petroski et al. | |
| 7,573,210 B2 | 8/2009 | Ashdown et al. | |
| 7,583,035 B2 | 9/2009 | Shteynberg et al. | |
| 7,598,685 B1 | 10/2009 | Shteynberg et al. | |
| 7,656,103 B2 | 2/2010 | Shteynberg et al. | |
| 7,665,999 B2 | 2/2010 | Hougham et al. | |
| 7,696,628 B2 | 4/2010 | Ikeuchi et al. | |
| 7,710,047 B2 | 5/2010 | Shteynberg et al. | |
| 7,710,050 B2 | 5/2010 | Preston et al. | |
| 7,777,236 B2 | 8/2010 | Pachler | |
| 7,800,315 B2 | 9/2010 | Shteynberg et al. | |
| 7,806,572 B2 | 10/2010 | Mcfadden et al. | |
| 7,810,955 B2 | 10/2010 | Stimac et al. | |
| 7,852,009 B2 | 12/2010 | Coleman et al. | |
| 7,852,300 B2 | 12/2010 | Shteynberg et al. | |
| 7,880,400 B2 | 2/2011 | Zhou et al. | |
| 7,888,881 B2 | 2/2011 | Shteynberg et al. | |
| 7,902,769 B2 | 3/2011 | Shteynberg et al. | |
| 7,902,771 B2 | 3/2011 | Shteynberg et al. | |
| 7,943,940 B2 | 5/2011 | Boonekamp et al. | |
| 7,952,294 B2 | 5/2011 | Shteynberg et al. | |
| 7,956,554 B2 | 6/2011 | Shteynberg et al. | |
| 7,977,698 B2 | 7/2011 | Ling et al. | |
| 7,980,863 B1 * | 7/2011 | Holec et al. | 439/67 |
| 8,004,211 B2 | 8/2011 | Van Erp | |
| 8,007,286 B1 * | 8/2011 | Holec et al. | 439/65 |
| 8,011,806 B2 | 9/2011 | Shiraishi et al. | |
| 8,038,329 B2 | 10/2011 | Takahasi et al. | |
| 8,045,312 B2 * | 10/2011 | Shrier | 361/126 |
| 8,061,886 B1 | 11/2011 | Kraus, Jr. et al. | |
| 8,065,794 B2 * | 11/2011 | En et al. | 29/847 |
| 8,067,896 B2 | 11/2011 | Shteynberg et al. | |
| 8,075,477 B2 | 12/2011 | Nakamura et al. | |
| 8,115,370 B2 | 2/2012 | Huang | |
| 8,124,429 B2 | 2/2012 | Norman | |
| 8,143,631 B2 | 3/2012 | Crandell et al. | |
| 8,162,200 B2 | 4/2012 | Buchwalter et al. | |
| 8,166,650 B2 | 5/2012 | Thomas | |
| 8,210,422 B2 | 7/2012 | Zadesky | |
| 8,210,424 B2 | 7/2012 | Weibezahn | |
| 8,227,962 B1 | 7/2012 | Su | |
| 8,232,735 B2 | 7/2012 | Shteynberg et al. | |
| 8,242,704 B2 | 8/2012 | Lethellier | |
| 8,253,349 B2 | 8/2012 | Shteynberg et al. | |
| 8,253,666 B2 | 8/2012 | Shteynberg et al. | |
| 8,264,169 B2 | 9/2012 | Shteynberg et al. | |
| 8,264,448 B2 | 9/2012 | Shteynberg et al. | |
| 8,410,720 B2 | 4/2013 | Holec et al. | |
| 8,500,456 B1 * | 8/2013 | Holec et al. | 439/65 |
| 8,525,193 B2 | 9/2013 | Crandell et al. | |
| 8,710,764 B2 | 4/2014 | Holec et al. | |
| 8,851,356 B1 | 10/2014 | Holec et al. | |

(56) References Cited

U.S. PATENT DOCUMENTS

| | | |
|---|---|---|
| 2001/0000906 A1 | 5/2001 | Yoshikawa et al. |
| 2001/0004085 A1 | 6/2001 | Gueissaz |
| 2002/0043402 A1 | 4/2002 | Juskey et al. |
| 2002/0148636 A1 | 10/2002 | Belke et al. |
| 2003/0052594 A1 | 3/2003 | Matsui et al. |
| 2003/0072153 A1 | 4/2003 | Matsui et al. |
| 2003/0079341 A1 | 5/2003 | Miyake et al. |
| 2003/0094305 A1 | 5/2003 | Ueda |
| 2003/0098339 A1 | 5/2003 | Totani et al. |
| 2003/0137839 A1 | 7/2003 | Lin |
| 2003/0193789 A1 | 10/2003 | Karlicek, Jr. |
| 2003/0199122 A1 | 10/2003 | Wada et al. |
| 2003/0223210 A1 | 12/2003 | Chin |
| 2004/0055784 A1 | 3/2004 | Joshi et al. |
| 2004/0060969 A1 | 4/2004 | Imai et al. |
| 2004/0079193 A1 | 4/2004 | Kokubo et al. |
| 2004/0087190 A1 | 5/2004 | Miyazawa et al. |
| 2004/0090403 A1 | 5/2004 | Huang |
| 2004/0239243 A1 | 12/2004 | Roberts et al. |
| 2004/0264148 A1 | 12/2004 | Burdick, Jr. et al. |
| 2005/0133800 A1 | 6/2005 | Park et al. |
| 2005/0207156 A1* | 9/2005 | Wang et al. |
| 2005/0242160 A1 | 11/2005 | Nippa et al. |
| 2005/0272276 A1 | 12/2005 | Ooyabu |
| 2006/0022051 A1 | 2/2006 | Patel et al. |
| 2006/0038542 A1 | 2/2006 | Park et al. |
| 2006/0221609 A1 | 10/2006 | Ryan |
| 2006/0245174 A1 | 11/2006 | Ashdown et al. |
| 2007/0157464 A1 | 7/2007 | Jeon et al. |
| 2007/0171145 A1 | 7/2007 | Coleman et al. |
| 2007/0194428 A1 | 8/2007 | Sato et al. |
| 2007/0210722 A1 | 9/2007 | Konno et al. |
| 2007/0217202 A1 | 9/2007 | Sato |
| 2007/0252268 A1 | 11/2007 | Chew et al. |
| 2007/0257623 A1 | 11/2007 | Johnson et al. |
| 2008/0143379 A1 | 6/2008 | Norman |
| 2008/0144322 A1 | 6/2008 | Norfidathul et al. |
| 2008/0160795 A1 | 7/2008 | Chen et al. |
| 2008/0191642 A1 | 8/2008 | Slot et al. |
| 2008/0249363 A1 | 10/2008 | Nakamura et al. |
| 2008/0254653 A1 | 10/2008 | Uka |
| 2008/0310141 A1 | 12/2008 | Mezouari |
| 2008/0311771 A1 | 12/2008 | Cho |
| 2009/0029570 A1 | 1/2009 | Ikeuchi et al. |
| 2009/0079357 A1 | 3/2009 | Shteynberg et al. |
| 2009/0103302 A1 | 4/2009 | Lin et al. |
| 2009/0117373 A1 | 5/2009 | Wisniewski et al. |
| 2009/0205200 A1 | 8/2009 | Rosenblatt et al. |
| 2009/0226656 A1 | 9/2009 | Crandell et al. |
| 2009/0230883 A1 | 9/2009 | Haug |
| 2009/0251068 A1 | 10/2009 | Holec et al. |
| 2009/0301544 A1 | 12/2009 | Minelli |
| 2009/0308652 A1* | 12/2009 | Shih ............................ 174/264 |
| 2010/0018763 A1* | 1/2010 | Barry ........................... 174/263 |
| 2010/0026208 A1 | 2/2010 | Shteynberg et al. |
| 2010/0109536 A1 | 5/2010 | Jung et al. |
| 2010/0110682 A1 | 5/2010 | Jung et al. |
| 2010/0187005 A1 | 7/2010 | Yeh |
| 2010/0213859 A1 | 8/2010 | Shteynberg et al. |
| 2010/0220046 A1 | 9/2010 | Plötz et al. |
| 2010/0308738 A1 | 12/2010 | Shteynberg et al. |
| 2010/0308739 A1 | 12/2010 | Shteynberg et al. |
| 2011/0051448 A1 | 3/2011 | Owada |
| 2011/0096545 A1 | 4/2011 | Chang |
| 2011/0115411 A1 | 5/2011 | Shteynberg et al. |
| 2011/0121754 A1 | 5/2011 | Shteynberg et al. |
| 2011/0157897 A1 | 6/2011 | Liao et al. |
| 2011/0309759 A1 | 12/2011 | Shteynberg et al. |
| 2011/0311789 A1 | 12/2011 | Loy et al. |
| 2012/0002438 A1 | 1/2012 | Gourlay |
| 2012/0014108 A1 | 1/2012 | Greenfield et al. |
| 2012/0068622 A1 | 3/2012 | Ward |
| 2012/0081009 A1 | 4/2012 | Shteynberg et al. |
| 2012/0081018 A1 | 4/2012 | Shteynberg et al. |
| 2012/0162990 A1 | 6/2012 | Crandell et al. |
| 2012/0188771 A1 | 7/2012 | Kraus et al. |
| 2012/0195024 A1 | 8/2012 | Kawaguchi et al. |
| 2013/0128582 A1 | 5/2013 | Holec et al. |
| 2014/0015414 A1 | 1/2014 | Holec et al. |
| 2014/0168982 A1 | 6/2014 | Crandell et al. |
| 2014/0197743 A1 | 7/2014 | Holec et al. |

FOREIGN PATENT DOCUMENTS

| | | |
|---|---|---|
| EP | 2505044 | 10/2012 |
| JP | 59186388 | 10/1984 |
| JP | 01319993 | 12/1989 |
| JP | 05090726 | 4/1993 |
| JP | 2002043737 | 2/2002 |
| JP | 2002117707 | 4/2002 |
| JP | 2006080227 | 3/2006 |
| JP | 2010153549 | 7/2010 |
| JP | 2011169791 | 9/2011 |
| WO | 2007076819 | 7/2007 |
| WO | 2011077778 | 6/2011 |
| WO | 2011064107 | 3/2013 |

OTHER PUBLICATIONS

"3M Thermally Conductive Adhesive Transfer Tapes", 3M Electronic Adhesives and Specialties Department, Engineered Adhesives Division, Sep. 2002, 1 pg Sep. 2002, 1.

"3M Thermally Conductive Adhesive Transfer Tapes—Technical Data", Electronic Adhesives and Specialties Department, Engineered Adhesives Division, Sep. 2002, (6 pages).

Murray, Cameron T. et al., "3M Thermally Conductive Tapes", 3M Electronic Markets Materials Division, Mar. 2004 (39 pages).

"Custom LUXEON Design Guide", Application Brief AB12, Mar. 2006 (14 pages).

"DRAGONtape DT6 Data Sheet", Sep. 2007 (4 pages).

"DRAGONtape Product Information Bulletin", 2007 (2 pages).

"DRAGONtape Product Information Bulletin", Osram, Nov. 2005 (4 pages).

"Final Office Action", for Application U.S. Appl. No. 13/158,149, mailed Mar. 6, 2013 (11 pages).

"Final Office Action", mailed Aug. 7, 2012 in U.S. Appl. No. 13/190,639, "Interconnectable Circuit Boards," (25 pages).

"Final Office Action", mailed Mar. 15, 2012 in co pending U.S. Appl. No. 12/419,879, "Solid State Lighting Circuit and Controls"(10 pages).

"Flex Connectors User's Guide", Osram Sylvania, Oct. 2007 (6 pages).

"Fr406 High Performance Epoxy Laminate and Prepreg", Isola, 2006 (2 pages).

"Fr406: High Performance Epoxy Laminate and Prepreg", http://www.isola-group.com/en/products/name/details.shtl?Mar. 13, 2008 (1 page).

"High Performance Epoxy Laminate and Prepreg", Isola, Mar. 2007 (3 pages).

"Ipc-4101B: Specification for Base Materials for Rigid and Multilayer Printed Boards", Mar. 2006 (109 pages).

"Kapton Polyimide Film", DuPont Electronics, http://www2.dupont.com/Kapton/en_US/index.html, Feb. 2008 (9 pages).

"Linear Products", Osram Sylvania, http://www.sylvanaia.com/BusinessProducts/Innovations/LED+Systems/Linear/, 2004 (1 page).

"LINEARlight Flex & Power Flex LED Systems", Osram Sylvania, http://www.sylvania.com/AboutUs/Pressxpress/Innovation/LightingNews(US)/2007/USLi, Sep. 2007 (3 pages).

"LINEARlight Flex Topled: Flexible LED Strip", Osran Sylvania LED Systems Specification Guide, 2007 (p. 100).

"LINEARlight Power Flex: Flexible High Light Output LED Modules", Osram Sylvania, Apr. 2008.

"LINEARlight Power Flex: Flexible LED Strip", Osran Sylvania LED Systems Specification Guide, 2007 (p. 96).

"LINEARlight Power Flex: LM10P Data Sheet", May 2007 (4 pages).

"Nichia Application Note", Oct. 2003 (p. 5).

(56) References Cited

OTHER PUBLICATIONS

"Non Final Office Action", mailed Jul. 26, 2011 in co pending U.S. Appl. No. 12/419,879, "Solid State Lighting Circuit and Controls"(16 pages).

"Non-Final Office Action", for U.S. Appl. No. 13/158,149, mailed Jul. 3, 2013 (32 pages).

"Non-Final Office Action", mailed Oct. 1, 2012 in U.S. Appl. No. 13411322, "Layered Structure For Use With High Power Light Emitting Diode Systems," (18 pages).

"Non-Final Office Action", mailed Aug. 22, 2012 in co-pending U.S. Appl. No. 13/158,149, "Flexible Circuit Board Interconnection and Methods," (27 pages).

"Non-Final Office Action", mailed Aug. 3, 2012 in U.S. Appl. No. 12/419,879, "Solid State Lighting Circuit and Controls," (17 pages).

"Notice of Allowance", for U.S. Appl. No. 13/158,149, mailed Feb. 11, 2014 (12 pages).

"Notice of Allowance", for U.S. Appl. No. 13/791,228, mailed Dec. 10, 2013 (36 pages).

"Notice of Allowance", from U.S. Appl. No. 13/411322, mailed May 10, 2013, 29 pages.

"Notice of Allowance", mailed Nov. 16, 2011 in co-pending U.S. Appl. No. 12043424, "Layered Structure for Use With High Power Light Emitting Diode Systems," (9 pages).

"Notice of Allowance", mailed Dec. 3, 2012 in co pending U.S. Appl. No. 12/419,879, "Solid State Lighting Circuit and Controls" (17 pages).

"Nud4001—High Current LED Driver", Semiconductor Components Industries, LLC http://onsemi.com, Jun. 2006 (8 pages).

"Product Information Bulletin HF2STick XB: Hi-Flux 2nd Generation Module", Osram Sylvania, Jan. 2008 (4 pages).

"Response to Final Office Action", for U.S. Appl. No. 12/406,761 mailed Oct. 12, 2010 (10 pages).

"Response to Final Office Action", for U.S. Appl. No. 12/158,149, mailed Jun. 6, 2013 (10 pages).

"Response to Final Office Action", mailed Mar. 15, 2012, in co-pending U.S. Appl. No. 12/419,879, filed with USPTO Jun. 15, 2012 (8 pages).

"Response to Non-Final Office Action", for U.S. Appl. No. 13/158,149 mailed Feb. 21, 2013 (12 pages).

"Response to Non-Final Office Action", for U.S. Appl. No. 13/411,322, mailed Jan. 3, 2013 (6 pages).

"Response to Non-Final Office Action", for U.S. Appl. No. 13/158,149, mailed Jan. 2, 2014 (14 pages).

"Response to Non-Final Office Action", mailed Aug. 3, 2012, in co-pending U.S. Appl. No. 12/419,879, filed with USPTO Nov. 5, 2012 (7 pages).

"Response to Non-Final Office Action", mailed Jul. 26, 2011, in co-pending U.S. Appl. No. 12/419,879, filed with USPTO Dec. 27, 2011, (7 pages).

"Response to Non-Final Office Action", mailed Oct. 1, 2012 in U.S. Appl. No. 13/411,322, "Layered Structure for Use With High Power Light Emitting Diode Systems", (6 pages).

"TechniMask ISR 1000 Series", Technic, Inc., http://www.technic.com/pwb/solderisr1000.htm, 2003 (1 page).

"T-lam System—Thermally Conductive Circuit Board Materials", http://www.lairdtech.com/pages/products/T-Lam-System.asp, Feb. 2008 (7 pages).

O'malley, Kleran, "Using the NUD4001 to Drive High Current LEDs", http://onsemi.com, Feb. 2005 (4 pages).

Non-Final Office Action, for U.S. Appl. No. 13/592,090, mailed Sep. 5, 2014 (39 pages).

"Non-Final Office Action", for U.S. Appl. No. 14/015,679, mailed Apr. 1, 2014 (7 pages).

"Notice of Allowance", for U.S. Appl. No. 13/158,149, mailed Jun. 6, 2014 (12 pages).

\* cited by examiner

CIRCUIT BOARD HAVING A PLATED THROUGH HOLE PASSING THROUGH CONDUCTIVE PADS ON TOP AND BOTTOM SIDES OF THE BOARD AND THE BOARD

CROSS-REFERENCE TO RELATED APPLICATIONS

The present application is a divisional application of U.S. patent application Ser. No. 13/190,639, filed on Jul. 26, 2011, and which is a continuation application of U.S. patent application Ser. No. 12/406,761, filed on Mar. 18, 2009, now U.S. Pat. No. 8,007,286, and which claims the benefit of U.S. Patent Application Ser. No. 61/037,595, filed on Mar. 18, 2008, and U.S. Patent Application Ser. No. 61/043,006, filed on Apr. 7, 2008, the content of all of which is herein incorporated by reference in its entirety.

FIELD OF THE INVENTION

Embodiments of the present invention relate to the design and method of interconnecting printed circuit boards. Particularly, embodiments of the present invention disclose a method for making long or continuous circuit strips, grids, matrices or links structures using the same. More particularly, embodiments of the present invention disclose the construction of layered, semi-flexible interconnected circuits for use with high powered LEDs in Solid-State Lighting (SSL) applications.

BACKGROUND OF THE INVENTION

In many electronic systems and products, multiple printed circuit boards are used with connectors, harnesses and cables making circuit connections between them. Interconnection of circuit boards may be accomplished by the use of surface mount connectors, wires or wire cables, flex circuit strips, edge connectors, wire pins or shunts. Typically, these connections carry power from one circuit to another, as well as conductors for electronic communication, sensing and control. While there are many types of connections, there are limitations and disadvantages to most of them.

In some applications it is desirable to connect one board to another over a short distance, with minimal numbers of components and material employed in the connection. Further, the type and number of interconnections has a strong effect on reliability. Conventional cables and harnesses employ wires, terminals and pins, which must be joined together mechanically. Failure in any one of these joints or reduction in conductivity due to mechanical effects, corrosion or fracture will cause failure of the circuit. For this reason, solder joints are often used because of their reliability and permanence.

Solder connection between circuit boards, while being reliable, usually require the spanning of the distance between boards or conductors with a conductor such as a pin (e.g., a shunt being a larger form of pin) or a wire. Pins are rigid and sometimes present unwanted stresses on the board and connection locations (e.g., the pads and holes). Secondary mechanical structures are added to reduce and control stresses. The pins themselves must be soldered to the board either manually (e.g., one at a time) or using special equipment. Press-in pins (e.g., pins, which rely on mechanical interference with conductors or pads) are sometimes used when geometries are fixed and well controlled.

Wires are flexible but are more difficult to reliably solder join and lack the structure for mechanical linkage when this is required. Typically, wires are directly soldered onto boards and are inserted through holes or soldered onto an enlarged copper pad. Direct soldering of wires is often done manually or with the use of equipment specialized for this purpose. Additional mechanical structures, called strain relief, are required to prevent mechanical fatigue and fraying of the wire adjacent to the solder joint if any type of motion or vibration is anticipated.

A third type of interconnect, called a flex circuit, is particularly advantageous where multiple circuits are joined carrying small amounts of current in limited space. Flex circuits are typically made by printing a thin metal conductive layer with a conductive pattern on a highly flexible plastic substrate. To prevent damage to the thin conductive layer, an additional layer of plastic is laminated over the conductor to form a sandwich. Access to the conductors is provided via holes in one or both of the plastic layers. Still, in order to gain robustness at the connecting ends, mechanical connectors or soldered pins must be added to the design. Flex circuits usually do not add to the mechanical stability or strength of the board-to-board connection.

For almost all of these connection methods described above, protection of the connection from shorting contact, mechanical damage or ESD (electro-static discharge) requires an additional mechanical cover or coating to be added after the solder connection, adding more complexity and cost to the implementation. Also, most of these interconnection methods present difficulties because of their mechanical sizes, geometries and lack of precise and flat mating surfaces for use on strictly surface mount boards.

In various applications, such as production of high power solid-state (LED) lighting strips it is advantageous to have interconnections between circuit boards which are highly reliable, carry significant levels of current or voltage without loss, are protected from mechanical damage and shorting, allow various shapes and geometries of connection and are easy and efficient to apply.

Long lengths and or continuous runs of SSL circuit strips are desirable for the reasons stated above. In addition, in order to make best use of circuit materials while distributing SSL components for area coverage and light direction, or to allow efficient shaping of the circuit to conform with the topology, curves and recesses of the structure it is to be attached to, it is highly desirable have a reliable interconnection between individual circuits.

In addition, the format of these semi-flexible continuous circuits is beneficial to the manufacture of the continuous circuit or installation into the final SSL fixture. Embodiments of the present invention described below conceive numerous methods to reduce manufacturing, installation and assembly costs. These system cost reductions further enable the adoption of SSL in a variety of applications, thus, reducing global energy consumption.

Solid-state lighting (SSL) refers to a type of lighting utilizing light-emitting diodes (LEDs), organic light-emitting diodes (OLEDs), or polymer light-emitting diodes (PLEDs) as sources of illumination rather than electrical filaments, plasma (e.g., used in arc lamps such as fluorescent lamps) or gas. The term "solid-state" refers to the fact light in an LED is emitted from a solid object; a block of semiconductor rather than from a vacuum or gas tube, as is the case in traditional incandescent light bulbs and fluorescent lamps. Compared to incandescent lighting, however, SSL creates visible light with reduced heat generation or parasitic energy dissipation, similar to fluorescent lighting. In addition, its solid-state nature provides for greater resistance to shock, vibration and wear, thereby increasing its lifespan significantly. Solid-state lighting is often used in area lighting, signage, traffic lights and is also used frequently in modern vehicle lights, train marker lights, etc.

BRIEF SUMMARY OF THE INVENTION

In some embodiments, an interconnectable circuit board may include one or more of the following features: (a) a distal end having a first electrically conductive pad located on a top of the circuit board, (b) a plated through hole on the conductive pad which passes through a conductive layer of the circuit board and an insulative layer of the circuit board, (c) a second electrically conductive pad coupled to the plated through hole, (d) a proximal end having a third electrically conductive pad attached to the top of the circuit board, (e) alignment marks for use in aligning circuit boards when interconnecting them, (f) cut marks showing locations where the circuit board can be cut, (g) circuit paths electrically coupled the electrically conductive pads to provide electrically interconnectivity between the circuit board and a second circuit board, (h) a non-conductive solder repelling material on a surface of the circuit board, and (i) a fourth conductive pad for electrically receiving electronic components.

In some embodiments, an apparatus for connecting circuit boards may include one or more of the following features: (a) a first circuit board having a first electrically conductive pad located on a top of the first circuit board, (b) a plated through hole on the first conductive pad which passes through the circuit board, (c) a second electrically conductive pad coupled to the plated through hole located on a bottom of the first circuit board, (d) a second circuit board having a third electrically conductive pad on a top of the second circuit board, wherein the first circuit board can be placed upon the second circuit board with the second conductive pad and third conductive pad aligned to create an electrical connection between the first circuit board and the second circuit board, (e) alignment marks located on the top of the first and second circuit boards for use in aligning the first and second circuit boards when interconnecting them, (f) cut marks showing locations where the circuit board can be cut, and (g) a fourth conductive pad for electrically receiving electronic components.

In some embodiments, an interconnectable circuit board may include one or more of the following features: (a) a first electrically conductive pad located on a top of the circuit board, (b) a plated through hole on the conductive pad which passes through the circuit board, (c) a second electrically conductive pad coupled to the plated through hole; the second conductive pad capable of being electrically connected to a third electrically conductive pad attached to a top of a second interconnectable circuit board, (d) cut marks indicating safe locations for separating the circuit board, and (e) a second cut mark adjacent to the first cut mark where the area between the first and second cut mark can be utilized to make a safe cut through the circuit board.

DETAILED DESCRIPTION

Figure 1:
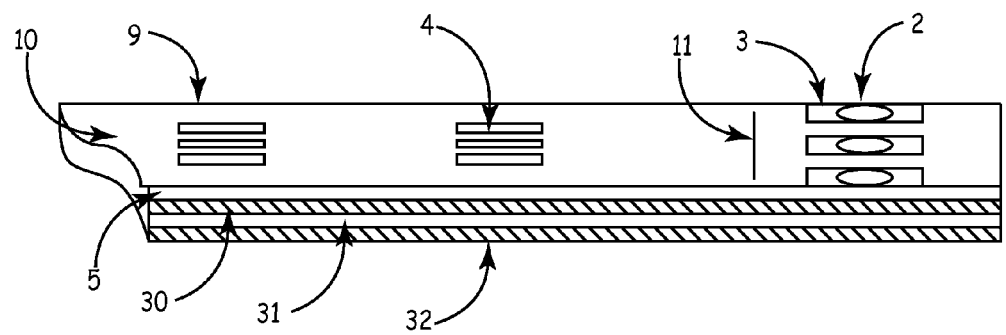
FIG. 1 shows a top and cut away view exposing layers of a circuit board with connection pads in an embodiment of the present invention.

The following discussion is presented to enable a person skilled in the art to make and use the present teachings. Various modifications to the illustrated embodiments will be readily apparent to those skilled in the art, and the generic principles herein may be applied to other embodiments and applications without departing from the present teachings. Thus, the present teachings are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of the present teachings. Skilled artisans will recognize the examples provided herein have many useful alternatives and fall within the scope of the present teachings.

The inventors of embodiments of the present invention have developed an alternative interconnection design and method of connection replacing or augmenting the use of rigid connectors, wires, cables or flex circuits. This connection design works effectively with a variety of printed circuit boards, shapes and sizes. This method of interconnect uses thin substrate printed circuit boards specially designed for surface mount and manual soldering to join circuit boards.

The connection design is desirable for several reasons, not only for ease of assembly, but also for the structure, appearance and reliability of the connection. Further, because the circuits can be fabricated using conventional printed circuit board methods, the interconnect geometry can be easily adapted for any angle, split, and for a wide variety of pad sizes and spacing. This connection design can be implemented to span short distances between boards or to join boards placed end to end. This connector is highly effective in joining printed circuit strips into larger strips, arrays and matrices, as might be used for SSL lighting applications.

Embodiments of the present invention described below describe interconnections providing advantages over both traditional and more recent methods of interconnect such as the newly introduced FlexRAD™ system of continuous connection. Embodiments of the present invention include aspects addressing the strength, reliability and usability of interconnects between the semi-flexible substrates in order to produce long strips or continuous reels for ease in fixture assembly.

Embodiments of the present invention provide for a thin board substrate, which makes the connector flexible enough to conform to normal variations of board thickness, solder height and mechanical mounting height differences. The thin board substrate allows heat and solder to easily flow through the connector from top to bottom. An electrical insulating layer within the thin board is both thin enough to enable a high degree of thermal conductivity and is able to maintain high levels of breakdown isolation. The material chosen for the electrically insulating layer enhances thermal conductivity.

The thin board substrate adds flexibility to the connection, reducing stress at the solder joint associated with the use of rigid pins and other types of connectors. This assists in preventing tearing of the printed circuit board pads on the board when bending stresses are introduced. The thin board substrate materials and thicknesses assist in handling solder melt temperatures without delamination or damage. Copper pads on the bottom side of the connector are designed to match the pads of the boards to be connected; in spacing, area and thermal characteristics.

Copper pads on a top side can receive heat (e.g., from a soldering iron) and provide a path for conduction through the electrically insulating substrate and/or a plated through hole to the pads on the bottom. The copper conductors are used to connect the pads to be mated to the printed circuit boards. The copper conductors can be thick to accommodate high currents. Copper conductors can be run on top or under the connector insulating substrate, depending on requirements for isolation, current carrying capacity and protection.

Embodiments of the present invention provide for copper foils designed to maintain gap distances between connections for electrical isolation. Connections and conductors are protected from damage or shorting by being covered by the connector body. Connections and conductors can be further protected from moisture by the simple addition of an under fill layer of potting material, an encapsulant or an overcoat of potting material or encapsulant.

Plated holes located at the pad positions, through the connector board allow solder and heat to flow down into the connection both to facilitate solder connections and to enable rapid connection. The plated holes located at the pad positions take up excess solder when solder paste is used to make connections or when solder is applied manually. The plated holes located at the pad positions can be used to store solder paste for later reflow.

Embodiments of the present invention provide for sealing of solder paste in the holes at the pad positions so the paste remains fresh for later use. The sealing may include a thin solder layer, a thin flux layer or a thin plastic or metallic peel-off material.

Angled or other geometric patterns in the pad and copper conductors support connections for offset or angled printed circuit boards. Multiple pad sets and associated conductor connections allow splitting of conduction paths.

A masking coating over the top and the bottom of the connector board (open at the pads), reduces the opportunity for solder shorts and improve the appearance of the connector. The masking material can be chosen to match the color and characteristics of the boards being jointed to minimize the visibility of the connector.

The connectors can be easily formed for vertical step offsets. Connectors onto which other circuits can be used, including pads and geometries for wire or other conventional types of connectors, as well as terminations and active circuitry. The connectors can be stackable. Connectors with substrate can extend well beyond pad areas providing mechanical support. Connectors with additional pads can provide additional strain relief.

The pad geometries may match existing pinned connectors to allow an option to alternate use of pinned connectors. The thin board can be designed to be cut with scissors or a simple shear. Printed lines at the top of the strip or matrix can show expected cut lines; providing guidance. Copper pads, holes and conductors can be a sufficient space from the cutting location to assure only electrically insulating substrate will be cut.

Embodiments of the present invention provide for intimate contact between metal pads with minimal fill layer of solder to increase joint strength. Larger pads can be used to increase the strength, both because of the larger solder contact area, but also because of the larger areas of contact and adhesion between pad and insulating substrate. Larger areas of conductor surrounding exposed, soldered pad apertures increase the strength both by offering more area for adhesion between conductors and the insulating substrate, but also because they add to the conductor structure. The spacing of the pads for maximum array width and height increases the joint strength against shear and rotational forces and torques. A space between pad and edges of the board can be maintained to increase strength by decreasing leverage and converting stresses into surface pressures away from the joint.

Embodiments of the present invention disclose increasing the number of holes leading from the top surface to the pad, which increases the strength by adding more areas of solder fill. The increased number of holes also increases the probability of having a better percentage of solder fill. The choice of solder type and composition can have an impact on joint strength. Lead baring solders have lower tensile strength then their lead free counterparts. Higher tensile strength increases the fracture strength of the connection.

Embodiments of the present invention provide for the application of thermal tape or adhesive across the bottom side of the joint to increase joint strength. The application of potting material or other adhesives or coatings of the structure adds additional strength to the joint. In the areas of board overlap, excluding the conductive pad locations, adhesive can be added to increase joint strength.

Embodiments of the present invention enable connection of two or more circuit boards to construct various forms, including linear strips and two and three dimensional arrays and matrix forms. Embodiments of the present invention include construction of flat grids of circuit boards, as well as grids able to be formed around curved surfaces or sharp corners. In alternate embodiments three dimensional shapes may be formed.

With reference to FIG. 1, a top and cut away view exposing layers of a circuit board with connection pads in an embodiment of the present invention is shown. The circuit board 9 can have two electrically conductive layers 30, 32 with a thin electrical isolating material 31 sandwiched in between. The inventors chose the electrically conductive layers to be 2 oz. copper. The inventors also chose the inner insulating layer to be 0.012 inch thick fiberglass composite material. Circuit paths of various designs can be etched into the top and bottom conductive layers 30, 32 to produce the circuit conductive paths. Plated through holes 2 can be added at metal pads 3 and plated through with conductive metal to form a connection between top and bottom. Additional thin layers of non-conductive solder repelling material 5 (solder masks) can be added to the top and bottom of the board 9 to restrict the movement of solder and protect the circuit paths from the pads 3. The solder mask 5 is interrupted to expose conductive pads 4 for mounting electronic components 13, as well as pads 3 used for board interconnect. On top of the solder mask 10, visible markings may be printed consisting of text and other circuit markings, and special alignment marks 11, 17 (FIG. 2A), 28 (FIG. 8C) and 29 (FIG. 8A) or cut marks 33, 34 (FIG. 13C).

In one embodiment the circuit boards 1 (FIG. 2A) and 9 consisted of a thin, low thermal mass substrate base material comprised of two electrically conductive layers with a thin, electrically isolating material sandwiched in between. Electrically conductive layers used for proof of concept testing consisted of 2 oz. copper. The thin, semi-flexible circuit boards can be designed with regions of conductors and pads allowing them to function as connectors, enabling the mating of one board to another. The circuit board consists of a thin, low thermal mass substrate base material comprised of two electrically conductive layers with a thin, electrically isolating material sandwiched in between. Electrically conductive layers used were of 2 oz. copper. The inner insulating layer was chosen to be 0.012 inch thick fiberglass composite material. Both of these are common to circuit board fabrication, however generally used for inner layers of a multilayer circuit board, not for circuit board in completion. Circuit patterns 60 (FIG. 4B) of various designs were etched into the top and bottom conductive layers to produce the circuit conductive paths. Holes 2 are added at the pad locations 3 and plated through with conductive metal to form a connection between top and bottom. Additional thin layers of non-conductive, solder repelling material 5 (solder masks) were added to the top and bottom of the board to restrict the movement of solder and protect the circuit paths away from the pads.

Circuit materials and thicknesses are of a design which allows circuit boards 1, 9 to be cut with a conventional shear or scissors 37 at any of several locations enabling later trimming to length or separation. It is fully contemplated circuit boards could be laser cut as well to obtain individual circuit strips or arrays. Electrical components, including LED emitters can be assembled onto circuit boards by conventional methods of electronic solder assembly.

Copper conductors can be used for connecting pads 4, 3 to be mated with other electronic components 13. These are etched or formed from the conductive layers 30, 32 described above. These circuit paths can be printed in almost any pattern commonly used in circuit boards and can be patterned to receive electronic components 13 such as LEDs 14 or integrated circuits. The copper conductors can be very thick and wide to accommodate high currents. In an embodiment 2 oz. copper was used with a conductor width of 0.040 inch to enable a low voltage drop across the connector when carrying up to 5 amps of current.

It is recognized there may be one or more conductive layers in the circuit board structure.

Copper foils are designed to maintain gap distances between connections for electrical isolation. In an embodiment, voltage isolations of up to 500 V were maintained by maintaining a distance of 0.025 inches between copper foils. By increasing the spacing, substantially higher isolations can be achieved. Copper conductors can be run on top of or under the connector insulating substrate, depending on requirements for isolation, current carrying capacity and protection.

Circuit boards 1, 9 can incorporate a variety of circuits, including pads and geometries for wire or other conventional types of connectors, as well as being able to incorporate terminations and active circuitry. The thin circuit board described above is particularly well suited because of its high thermally conductive structure for power and heat creating circuits. In one implementation, the circuitry for high current driver 13 (e.g., one semiconductor #NUD4001 operating at 24 VDC) along with a LED string 14 was added to the top side of the board. Both the top side FIG. 2A and bottom side FIG. 2B of the board were designed with large metal (e.g., copper) foils and pads which could translate heat through the thin insulating material 31 by effectively creating a large area for heat transfer from the top copper layer 30 through the less thermally conductive insulating layer 31 and to the bottom copper layer 32.

Connections and conductors can be further protected from moisture by the simple addition of an under fill layer of potting material or an encapsulant or an overcoat of potting material or encapsulant 24. Potting compounds or conformal coatings are commonly used in the industry to provide this type of protection. This type of connector is particularly suitable for these coatings because it is essentially flat with no recesses or areas which must be protected from contact with the coatings.

The material chosen for the electrical insulating layer 31 enhances thermal conductivity. In one embodiment the electrically insulating layer 31 was chosen as a high temperature variant of FR4 fiberglass with a glass transition temperature of 170° C., although other materials can be used. A higher than normal temperature rating of the material is intentionally used to gain more thermal margin allowing for the very rapid heating (and probable overheating during manual assembly) of the thin boards due to their low thermal mass. Even higher temperature materials would be helpful in the case higher melting temperature solders are to be used. It is helpful to use an insulating layer 31 both durable at high temperatures and as highly thermally conductive as possible for this construction. Thermal conductivity is helpful for the cases of solder iron or point heat source assembly because it aides in rapid transfer of heat from the top side of the pads 3 to pads 7 below.

Figure 2A:
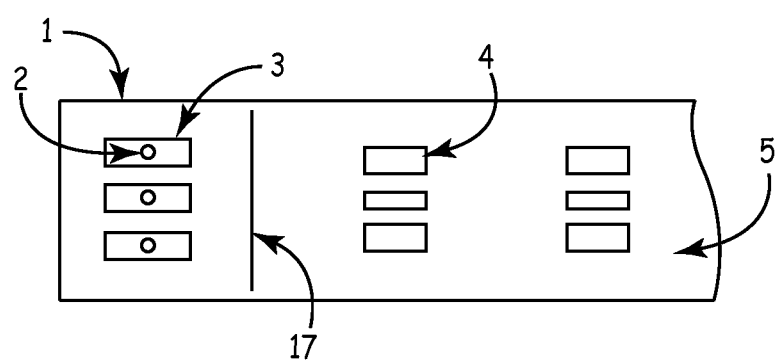
FIG. 2A shows a top view of top board pads and holes in an embodiment of the present invention.
Figure 2B:
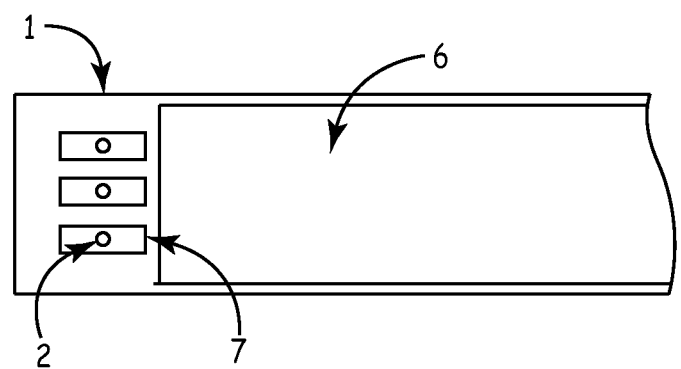
FIG. 2B shows a bottom view of top board pads and holes in an embodiment of the present invention.

With reference to FIG. 2A, a top view of circuit board 1 shows electrically conductive connection pads 3 and plated through holes 2. Conductive pads 4 are designed to accept electronic components 13 and printed alignment mark 17 as shown. FIG. 2B, show the bottom side of the same circuit board 1 with additional connection pads 7 and plated through holes 2. In this embodiment a large conductive area 6 was exposed to enable good thermal transfer and heat spreading from top side components and circuit paths to the bottom side. Optionally, the same area could be used for additional conductive paths and mounting of electronic components.

Figure 3:
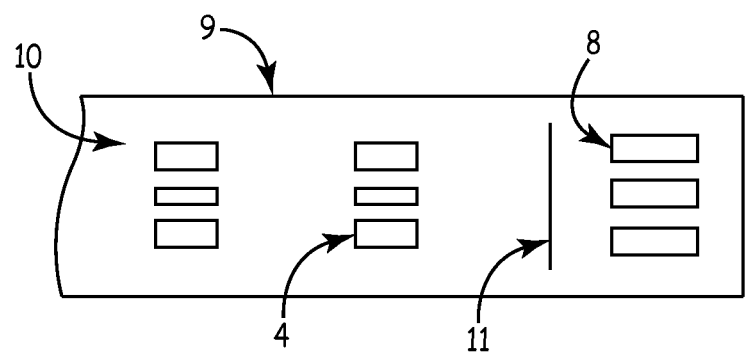
FIG. 3 shows a top view of bottom board receiving pad geometry in an embodiment of the present invention.

With reference to FIG. 3, the top side of a second circuit board 9 is shown. Electrically conductive connection pads 8 are designed to match the geometry and locations of the bottom side connection pads 7 of circuit board 1. Electrical components may be optionally mounted at exposed conductive pads 4 on this circuit board. In this embodiment an alignment mark 11 is printed on top of the solder mask 5.

Figure 4A:
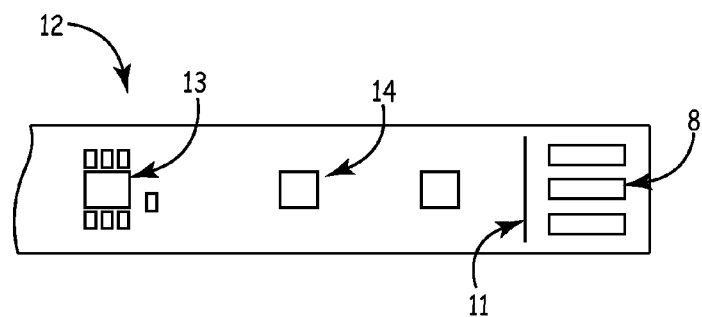
FIG. 4A shows a top view of an assembled board prior to joining in an embodiment of the present invention.

With reference to FIG. 4A, a fully assembled circuit board 12 is shown with electronic components 13 including LED's 14 mounted onto the board.

Figure 4B:
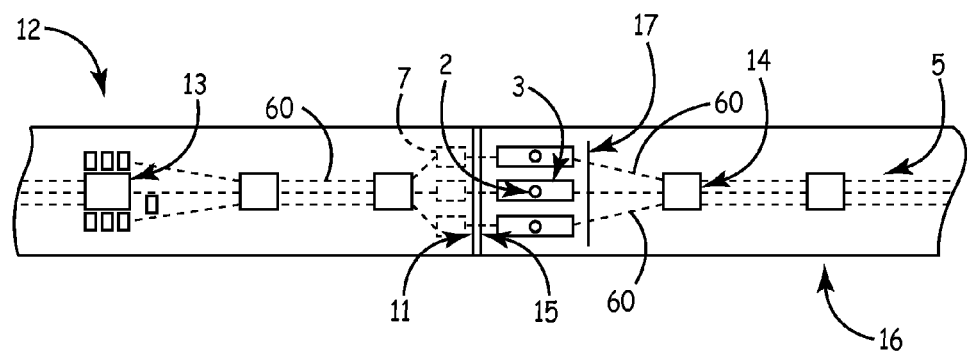
FIG. 4B shows a top view of joined boards in an embodiment of the present invention.

With reference to FIG. 4B, two fully assembled circuit boards 12, 16 are joined together. The lower circuit board 12 alignment mark 11 is used to align the edge 15 of the upper circuit board 16 so that the connection pads 8, 7 are in alignment. The upper circuit alignment mark 17 is used to align the edge of the lower circuit board. It is recognized one or both of these alignment marks may be of different shapes or forms or omitted in the joining process. It is also recognized mechanical alignment devices may be used including tooling holes, slots and sighting holes. However, in this embodiment, the inventors chose linear marks for simplicity and for visual verification of alignment accuracy.

Figure 5:
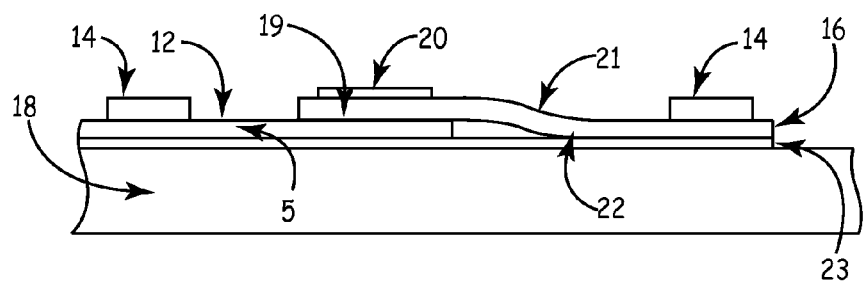
FIG. 5 shows a top profile view of an overlapping joint between boards in an embodiment of the present invention.

The circuit boards can be overlapped for interconnection (see FIG. 4B, FIG. 5). This is very useful if the connector board contains active circuitry and it is beneficial to connect multiple boards, such as in the fabrication of arrays of boards (see FIG. 10). The overlapping connections are highly advantageous to the assembly of strips consisting of multiple circuit boards (see FIG. 13C). In a practical application, they are used to make long circuit board strips or arrays of solid-state lighting circuits (e.g., high power LED emitters used as the individual light sources).

Thin board substrate materials and thicknesses are chosen to handle solder melt temperatures without delamination or damage. Alternate choices for board insulating material are possible such as Thermagon™ in cases where higher temperature resilience and higher thermal conductivity are needed. An embodiment was developed for use with lower temperature solders (e.g., leaded). Copper pads 7 on the bottom side of the upper board 1 are designed to match the pads of the bottom receiving board 8 in spacing, in area and in thermal characteristics.

With reference to FIG. 5, a side profile view of an overlapping joint between boards in an embodiment of the present invention is shown. In this embodiment a connection 19 is made by either welding or soldering the conductive pads 7 from the top board 16 to the bottom board conductive pads 8 on the bottom board 12. The size of pads 7, 8 factors into both the quality of the connection and the mechanical stress the connection can sustain. Also, by embedding or closely connecting through holes 2 to pads 7, 8 the mechanical performance is improved. The metal plating and optional solder fill through holes 2 links the top side pads 3 to bottom side 8 making the bottom side very difficult to pull off (delaminate) from the insulating layer 31. In the embodiment, holes of 0.036 inch diameter are used to promote heat transfer, conduct solder and add enough structure to strengthen the joint. Lapped joints add strength by adding additional contact area, by reducing leverage, and by changing certain forces from shearing and tensile to compressive.

The interconnect aspect of FIG. 5 allows for the coupling of circuit boards without a connector or any other device between them.

Plated through holes 2 located at pad positions 3, 7 through circuit board 16 allow solder and heat to flow down into the connection both to facilitate solder connection and to enable rapid connection. The rate of heat transfer being increased by this structure has the additional benefit of speeding up solder melting and cooling both during manual soldering and reflow processing. This saves time and results in better, more repeatable and stronger joints. It is known in the industry faster cooling times result in stronger, more uniform solder joints.

Thin circuit boards can be easily mechanically formed for vertical step offsets 21. In experiments run on these boards, bends up to a right angle could be performed with the conductors (or any foils crossing the bend) on the inside radius of the bend.

Figure 6:
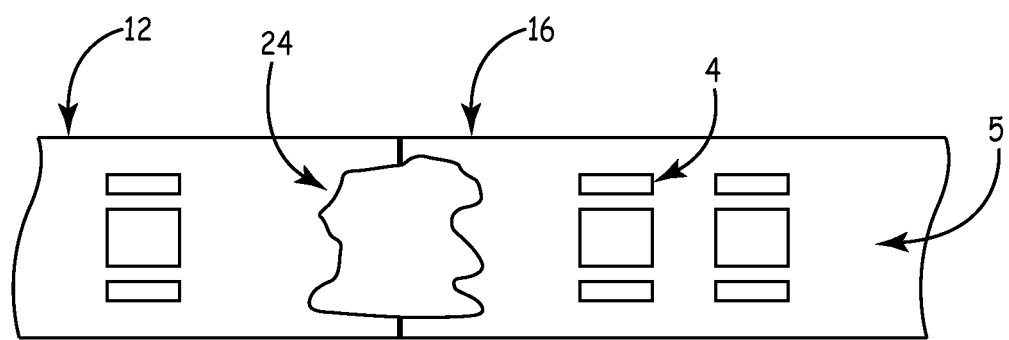
FIG. 6 shows a top profile view of potting material used to strengthen and protect connection joints in an embodiment of the present invention.

The application of tape or adhesive 23, across the bottom side of joint 20, further increases joint strength for handling. Viscous tapes act as a spring and dampener to certain stresses, moving forces away from the joint. The application of potting material 24 or other adhesives or coatings of structure adds additional strength to joint 20 as well as protection from mechanical damage and/or moisture (see FIG. 6).

The application of tape or adhesive 23 on the bottom side of the board assembly 22, allows the assembled strip or array to be directly fastened to a chassis, enclosure, or heat sink 18 without the use of mechanical fasteners. In applications for high power LEDs it is particularly useful to have the tape or adhesive be highly thermally conductive so heat can easily flow from the circuit boards to the heat sink 18. In one embodiment, a thermally conductive adhesive tape (e.g., 3M™ product #8810) was applied to the back side. The board assembly 22 can then be adhered to a heat sink 18. The resulting structure maintained excellent heat transfer to the heat sink, which is particularly helpful in high brightness LED applications.

Intimate contact between metal pads with minimal fill layer of solder increases strength for joint 19. A thick layer of solder decreases strength but adds some flexibility to the joint. Solder has generally a much lower tensile and shear strength than the conductors it joins. Further, solder tends to have a course crystalline structure and is susceptible to fracturing. A thin layer of solder between copper pads (used the pad material) is much less susceptible to fracturing both because of smaller (or incomplete) crystal formation, and because stresses are transferred locally to the stronger copper, instead of into the solder itself.

A number of experiments were conducted to determine solder wetting and flow paths for various pad geometries using the thin connectors in surface mount applications. After it is melted, solder tends to wet to the metal pads 3 and exposed conductors of printed circuit boards 1 and 9. It moves by capillary action to actively fill small gaps and spaces between pads 7 and 8, particularly pads in flat surface-to-surface contact. If solder was applied in exactly the correct amount, the solder would simply fill the joints. But even in small excess, the solder would press outside of the pad areas promoting shorts and lower electrical isolation. Holes, recesses or pockets between the pads were tried and did take up the excess solder. However, the approach was to design in plated holes 2 within the area of the pads 3 and 7 taking up the solder through capillary action, effectively pulling excesses into rather than out of the joint. In the embodiment, the holes were approximately 50% of the diameter of the pad, giving ample room for significant variances in solder application.

As a further improvement, plated holes 2 can be used as receptacles for solder paste so boards 12, 16 could be ready for joining by heat alone. Flux and activating resins, which are commonly incorporated into solder paste, are needed for high quality solder joints. In one embodiment, the same plated holes 2 absorb excess solder used to store solder prior to thermal joining. Further, it is recognized the holes can be filled with either solder paste or separated layers of hard solder and flux resin. In one experiment, solder wire with a core of flux resin was press fit in holes 2 and sheared to match the bottom surface plane of the circuit board 1. This was another effective way of putting solder and flux into plated holes 2. Sealing of solder paste in holes 2 at pad positions 3 and 7 is helpful so paste remains fresh for later use. Sealing may include a thin solder layer, a thin flux layer or a thin plastic or metallic peel-off material.

The thin circuit board as described is flexible enough to conform to normal variations of board thickness, solder height, and mechanical mounting height differences. Goals for high reliability connections include robustness, both in mechanical strength and in integrity of the electrical connection. Several designs and methods were explored and found to improve both mechanical strength, and in many cases to improve the electrical connection integrity. By increasing the number of pads 3, 7 and 8 used in the connector, mechanical strength was benefited. Simple multiplication of the number of contacts added to the strength by spreading stress across the added contacts. Redundant parallel contacts reduce electrical resistance and add to the general integrity of electrical connection.

Increasing the size of the pads 7 and 8 increases the strength both because of the larger solder contact area, but also because of the larger areas of contact and adhesion between pad and insulating substrate. In multiple trials, larger pads consistently increased the strength as measured in pull tests and in bending tests. Larger areas of conductor surrounding exposed soldered pad apertures increase the strength both by offering more area for adhesion between the conductor and the insulating substrate, but also because they add to the conductor structure.

Increasing the distance across a set of pads or span increases the joint strength against shear and rotational forces and torques. Shear and rotational forces (torques) are common during handling of the joined boards. Of particular use, the assembly of multiple boards into long strips presents the opportunity to put very high torques on the joint connection because of the length and lever arm advantage. Preventing damage due to rotational forces is helpful to having reliable joints when the strips are packaged and used in their multiple forms including strips and continuous reeled lengths.

By increasing the distance of the pads from the overlapping edges of the board, the inventors have found a decreased leverage on the individual connections by converting stresses into surface pressures away from the joint. By increasing the number of holes 2 leading from top surface to the pads below, an increase in the strength is discovered by adding more copper cylindrical connections and rivet like columns of solder fill linking top to bottom. Increased number of holes also increases the probability of having a better percentage of solder fill between the boards. The choice of solder type and composition can have a direct impact on joint strength. Lead baring solders have lower tensile strength then their lead free counterparts. Higher tensile strength increases the fracture strength of the connection.

Angled or other geometric patterns in the connection pad and copper conductors support connections for offset or angled printed circuit boards. Multiple pad sets and associated conductor connections allow splitting of conduction paths.

As part of the printed circuit board fabrication process, mask coatings can be placed over top of circuit boards and the bottom of circuit boards (open at the pads), reducing the opportunity for solder shorts and improving the appearance of the connector or overlapping joint. In the embodiments, the mask coating 5 was chosen to match the color and characteristics of the boards being jointed so to minimize the visibility of connection 20.

In the areas of board overlap, excluding the conductive pad locations, adhesive applied between top and bottom board can be added to increase joint strength. The board connections with overlapping joints can be used to construct elongated strips or arrays of multiple circuit boards (see FIG. 10 and FIG. 13C). Mass parallel construction of long circuit board strips carrying high intensity LEDs for SSL applications has been achieved using these connection types.

Figure 7:
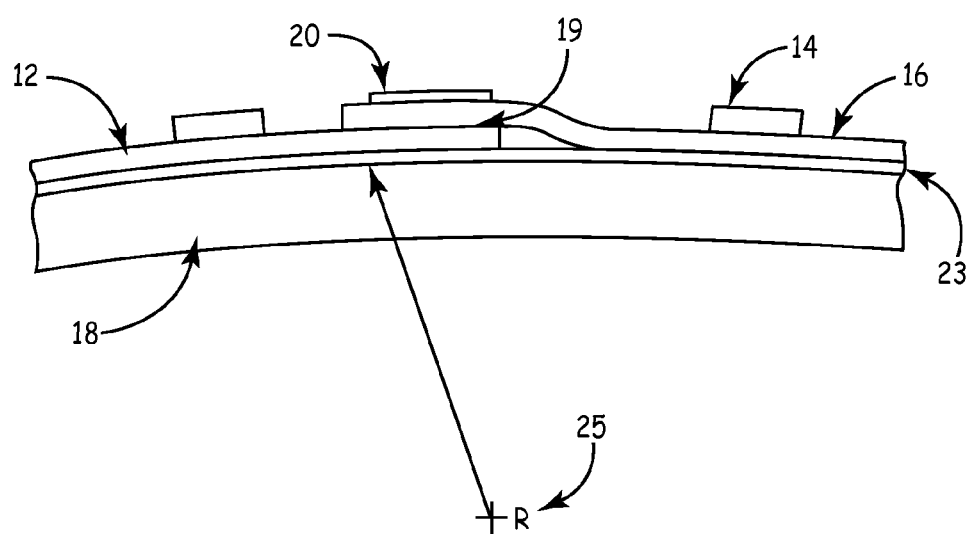
FIG. 7 shows a side view of a joint assembly of a flexible strip with curvature in an embodiment of the present invention.

With reference to FIG. 7, a side profile view of a board to board connector joint is shown in an embodiment of the present invention. Thin circuit boards 12 and 16 make connection 20 with an overlapping joint. The circuit boards and connection are flexible enough to conform to normal variations of board thickness, solder height and mechanical mounting height differences in many applications. In this embodiment, board to board connection is shown to bend with a radius 25 of less than 1 inch. The circuit boards are adhered to a heat sink 18 by double sided thermal adhesive tape 23, affecting a permanent and highly thermally conductive bond. The inventors have conceived of several other methods of attachment, including liquid adhesives, solder or welded bonds, mechanical fasteners, and spring tensioning. In high power LED applications, it is particularly helpful to have a good thermal connection to the heat sink because lower LED device temperatures improve brightness, efficiency and increase the expected life.

Figure 8A:
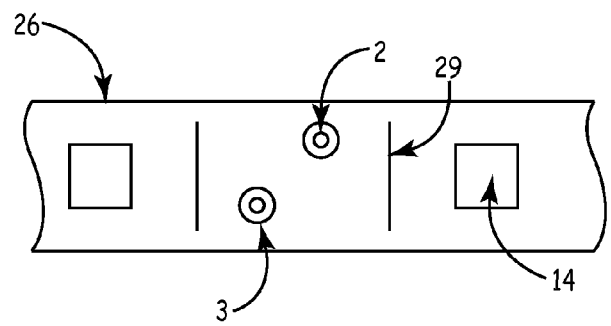
FIG. 8A shows a top view of the top board for a mid-length connection in an embodiment of the present invention.
Figure 8B:
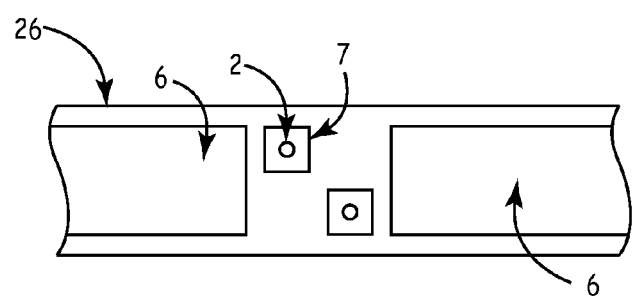
FIG. 8B shows a bottom view of the top board for a mid-length connection in an embodiment of the present invention.

With reference to FIG. 8A, an alternate embodiment is depicted placing the location of connection away from the end of the board. The layered construction of the circuit board has been described (see FIG. 1). Conductive pads 3 are shown with plated through holes 2 which pass through to pads 7 on the underside of the board 26. Printed alignment marks 29 provide guidance for connecting overlapping boards. The circuit board may be pre-assembled with electronic components, such as LEDs 14 and associated drive components. FIG. 8B shows the underside of the circuit board 26. The plated through holes 2 provide electrically conductive paths from the pads 3 at the top of the board to pads 7 at the bottom. Thermally conductive pads 6 may be etched or formed into the lower conductive layer enabling heat to better transfer and spread from the conductors, pads and components at the top of the circuit board. The bottom side pads 7 may be electrically isolated from the thermally conductive pads 6.

Figure 8C:
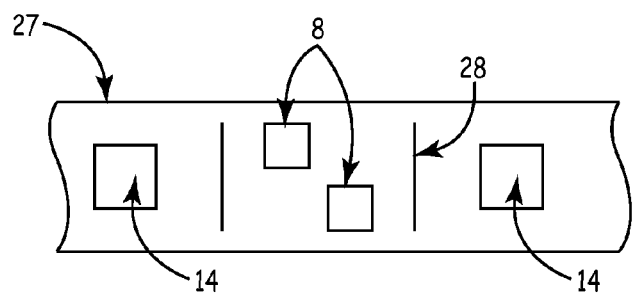
FIG. 8C shows a top view of the bottom board for a mid-length connection in an embodiment of the present invention.

FIG. 8C shows the top side of another circuit board 27 in this embodiment connecting to the circuit board 26. Electrically conductive pads 8 are designed to receive connection from the previously described board. Additional alignment marks 28 are used to guide in the assembly of the two boards.

Figure 9:
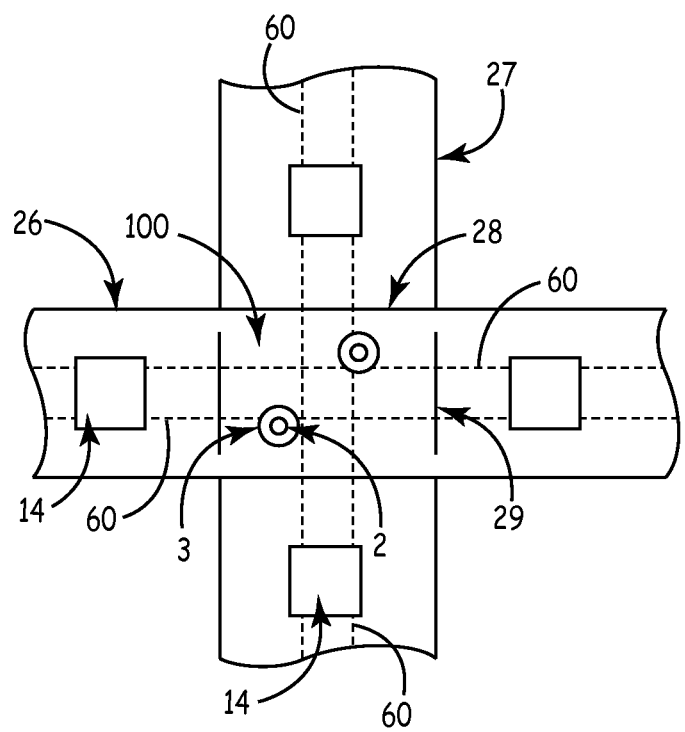
FIG. 9 shows a top view of an overlapping connection used in strip array construction in an embodiment of the present invention.

With reference to FIG. 9, two circuit boards 26 and 27 are joined at a right angle. Alignment marks from the lower circuit board 28 are used to locate the second circuit board squarely providing vertical guidance. Alignment marks 29 from the upper circuit board 26 align to the edges of the lower circuit board 27, providing horizontal guidance. As described earlier, solder or welding may be used to join the two boards forming a reliable joint 100, forming electrical connections between circuitry of the two boards.

The inventors conceive circuit boards may be joined at any angle and at any location within the circuit boards in accordance with this invention. Further, there are no limits to the number of locations and the number of circuit boards joined.

Figure 10:
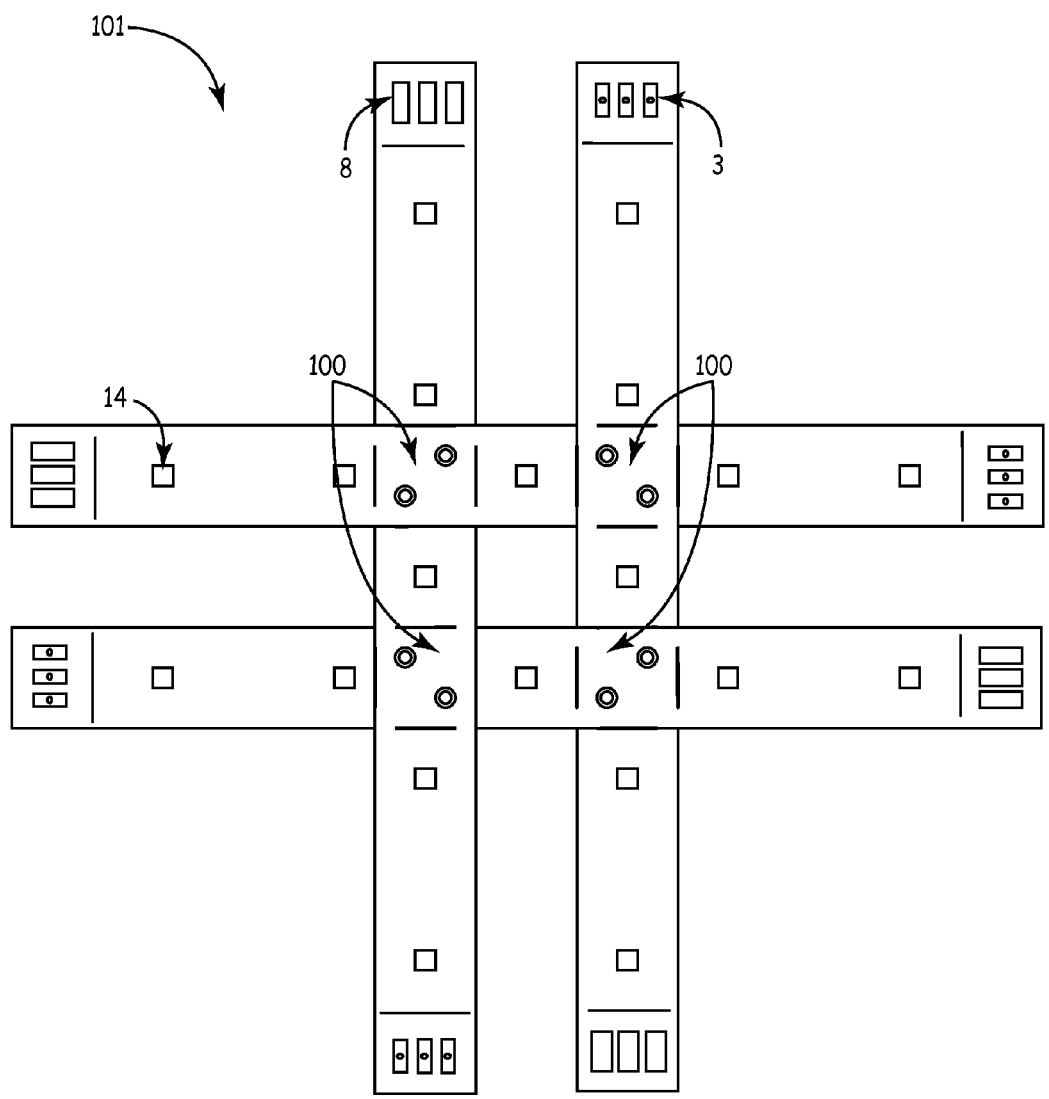
FIG. 10 shows a top view of the construction of a two board by two board grid array in an embodiment of the present invention.

With reference to FIG. 10, additional connections are made allowing the construction of a two board by two board array 101. The connection joint 100 is repeated four times in this embodiment. Additional connection pads 8 and 3 are indicated at the ends of the boards that can be used for connection to other boards or arrays.

The construction of circuit board arrays in accordance with this invention are particularly useful in SSL lighting applications because they reduce or eliminate wire and mechanical connector attachments and allow LEDs to be placed in specific geometric patterns without requiring as much printed circuit board material be used.

Figure 11:
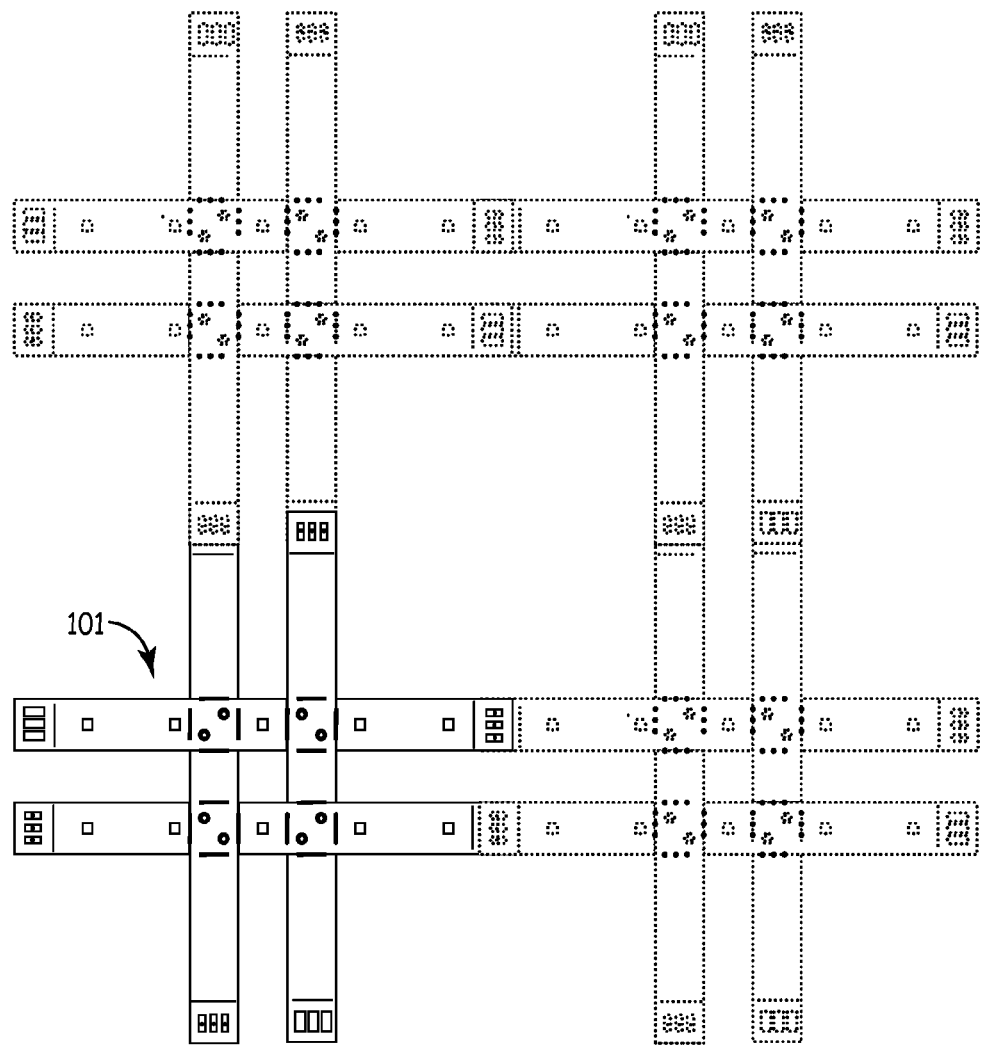
FIG. 11 shows construction of a larger grid using a two board by two board grid array in an embodiment of the present invention.

With reference to FIG. 11, construction of larger arrays and grids using building block arrays and circuit boards is conceived. In this embodiment, multiple two by two circuit board arrays 101 are connected to form a larger area array.

Figure 12:
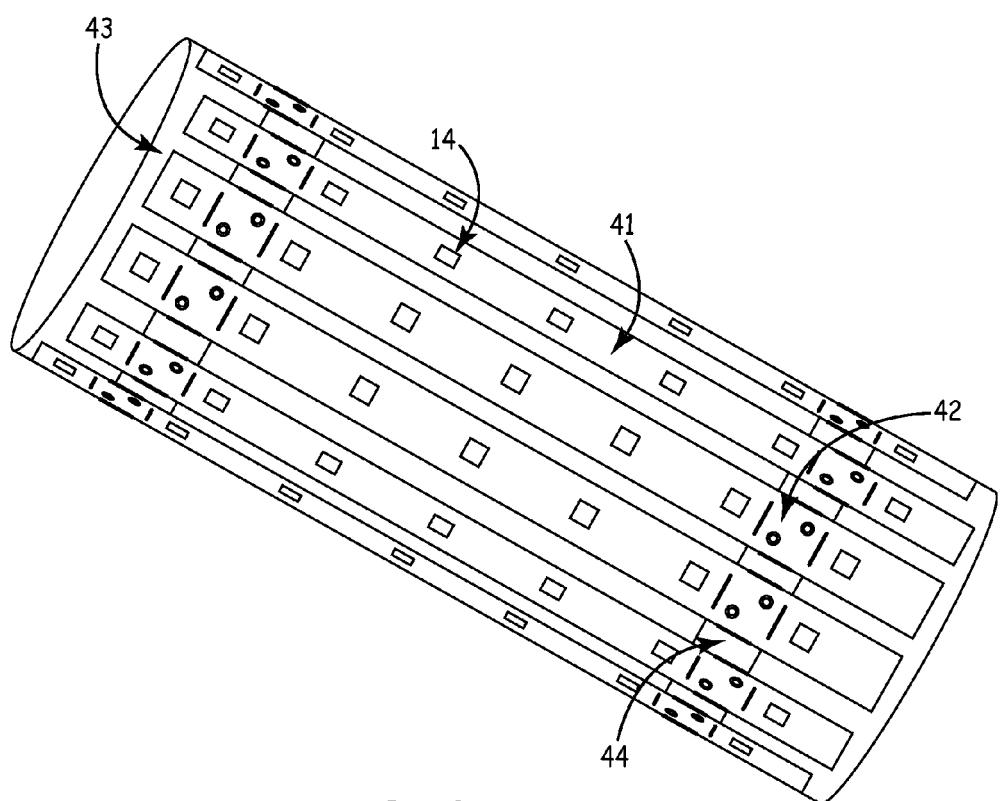
FIG. 12 shows another type of grid array wrapped around a cylindrical heat sink as an embodiment of the present invention.

With reference to FIG. 12, an alternate embodiment of an array is wrapped around a cylindrical drum 43. In this embodiment, elongated circuit boards 41 are joined to additional circuit boards 44 wrapping around the cylinder 43. The individual boards are joined at connection joints 42 similar to those already described.

Circuit boards of various shapes and sizes may be joined to create a wide variety of two and three dimensional arrays. The connection designs and methods conceived in the present invention makes it possible to assemble geometries and shapes of circuit board arrays distributing electronic devices and circuits spatially and enable them to be positioned and aimed for optimal effectiveness.

An aspect of the utility of constructing strips and arrays of circuit boards is the ability to shape them to size immediately prior to installation in a chassis or housing. Long strips and large arrays are preferable for shipment and stocking purposes, but it is highly desirable to be able to cut these into smaller strips and arrays fitting the fixtures and devices they are used in. The inventors have conceived a system of marking boards, strips and arrays to indicate safe locations for cutting. Further, the thin circuit board embodiments described above can be easily cut with simple shears or scissors 37 (or any of a variety of tools or cutting processes).

Figure 13A:
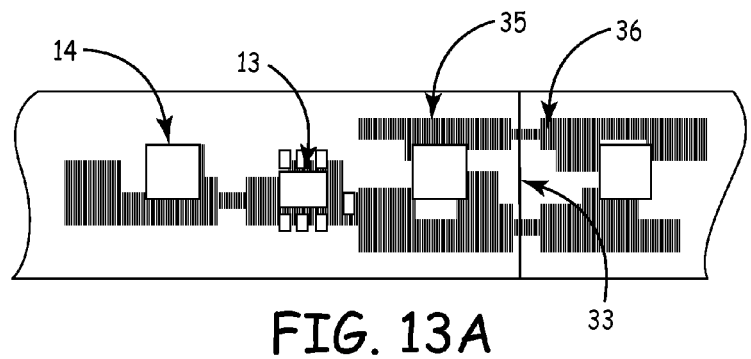
FIG. 13A shows a top view of a board with a cut mark line for board or array separation in an embodiment of the present invention.

With reference to FIG. 13A, a printed line is used to mark a safe location for circuit separation. Conductor patterns 35 etched into the conductive layers of the circuit boards are used to provide power and interconnect electronic components 13 such as LEDs 14. At locations designed in the circuit cut marks 33, 34 indicate the safe locations for separating interconnected circuits. In one embodiment, the circuit is continuous through the intended cut location. Signal conductors or traces passing power and optionally control signals will be cut at the same time as the boards or arrays are separated.

In order to minimize conductor damage and to minimize the opportunity for short circuits, circuit traces are narrowed at in the immediate area 36 of the cut marks 33. Further, the narrower traces are easier to cut because they offer less mechanical resistance. In one implementation, 2 oz. copper conductors were used with a width of 0.030 inches in the area of cut. Outside of this area conductors are expanded to improve their current carrying and thermal conduction capability. Outside of this area are additional components and conductors which could be damaged and are not intended to be cut or stressed in the cutting process.

It is recognized by the inventors there may not be conductors spanning the cut marks. There may be one or more power conductors, and one or more control signals spanning the locations for cut.

Figure 13B:
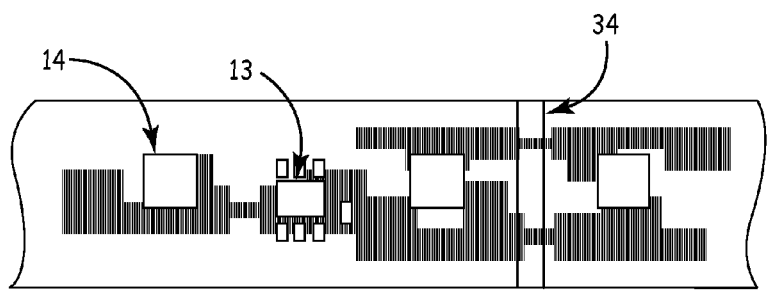
FIG. 13B shows a top view of a board with a double line cut mark for board or array separation in an embodiment of the present invention.
Figure 13C:
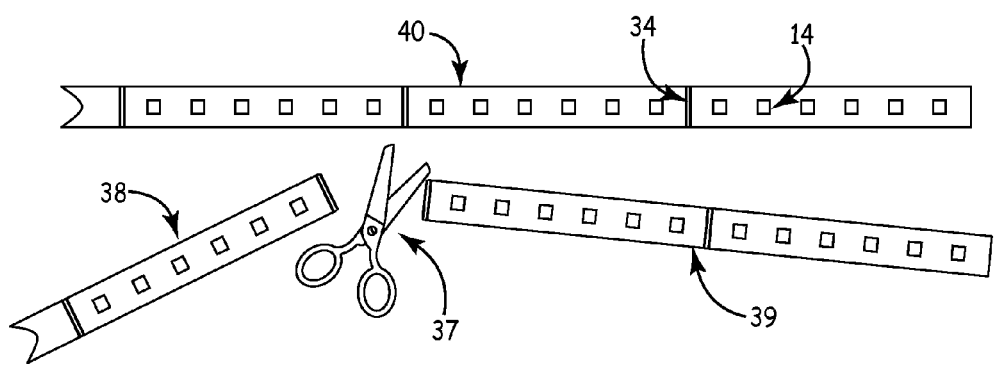
FIG. 13C shows the separation of two arrays of boards at one of the cut marks in an embodiment of the present invention.

With reference to FIG. 13B, a double line cut mark 34 is shown. The double line cut mark 34 has the advantage of showing the boundaries of the safe location for cutting the board or array. The inventors recognize other ways for indicating safe cutting area including dotted lines, areas of grey or colored printing, tick marks and hatch marks could be used.

With reference to FIG. 13C, circuit separation utilizing the cut marks is achieved with a simple scissors or shear 37. A long strip 40 or array is separated into two parts with one part 39 being of desired length, size, and shape for final installation, and the second part 38 either being the residual or another part ready for final installation.

The inventors conceive the cutting of strips or arrays assembled from multiple circuit boards may be conducted before or after the addition of electronic components onto these boards. Further, additional connections and wiring may be needed to complete the assembly. Also, after cutting, the resulting boards, strips, or arrays may again be assembled into other shapes and combinations using the connection designs described above.

While the present invention is directed towards flexible lighting circuit boards and more directly towards flexible LED circuit boards, it is fully contemplated the present invention could extend to most any type of circuit board system.

Thus, embodiments of the PRINTED CIRCUIT BOARD INTERCONNECT CONSTRUCTION are disclosed. One skilled in the art will appreciate the present teachings can be practiced with embodiments other than those disclosed. The disclosed embodiments are presented for purposes of illustration and not limitation, and the present teachings are limited only by the claims that follow.

The invention claimed is:

1. An interconnectable circuit board, comprising:
   a distal end having a first electrically conductive pad located on a top of the circuit board;
   a plated through hole on the conductive pad which passes through a first conductive layer of the circuit board, a second conductive layer of the circuit board, and an insulative layer of the circuit board disposed between the first conductive layer and the second conductive layer;
   a second electrically conductive pad located on a bottom of the circuit board, the second electrically conducutive pad coupled to the plated through hole; and
   a proximal end having a third electrically conductive pad attached to the top of the circuit board.

2. The circuit board of claim 1, further comprising alignment marks for use in aligning circuit boards when interconnecting them.

3. The circuit board of claim 1, further comprising cut marks showing locations where the circuit board can be cut.

4. The circuit board of claim 1, further comprising circuit paths electrically coupled the electrically conductive pads to provide electrically interconnectivity between the circuit board and a second circuit board.

5. The circuit board of claim 1, further comprising a non-conductive solder repelling material on a surface of the circuit board.

6. The circuit board of claim 1, further comprising a fourth conductive pad for electrically receiving electronic components.

7. The circuit board of claim 1, wherein the insulative layer is sandwiched between the conductive layer and a second conductive layer.

8. An apparatus for connecting circuit boards, comprising:
   a first circuit board having a first electrically conductive pad located on a top of the first circuit board;
   a plated through hole on the first conductive pad which passes through the circuit board;
   a second electrically conductive pad coupled to the plated through hole located on a bottom of the first circuit board; and
   a second circuit board having a third electrically conductive pad on a top of the second circuit board, wherein the first circuit board can be placed upon the second circuit board with the second conductive pad and third conductive pad aligned to create an electrical connection between the first circuit board and the second circuit board;

wherein when the first circuit board is placed upon the second circuit board, the length of the first circuit board and the second circuit board is greater than the individual length of first circuit board and greater than the individual length of the second circuit board.

9. The circuit board of claim 8, further comprising alignment marks located on the top of the first and second circuit boards for use in aligning the first and second circuit boards when interconnecting them.

10. The circuit board of claim 8, further comprising cut marks showing locations where the circuit board can be cut.

11. The circuit board of claim 8, wherein the first and second circuit boards can be coupled at any angle.

12. The circuit board of claim 8, wherein additional circuit boards could be coupled to the first and or second circuit board.

13. The circuit board of claim 8, further comprising a fourth conductive pad for electrically receiving electronic components.

14. The circuit board of claim 8, wherein the first and second circuit boards can be coupled together with solder.

15. An interconnectable circuit board, comprising:
a first electrically conductive pad located on a top of the circuit board;
a plated through hole on the conductive pad which passes through the circuit board; and
a second electrically conductive pad coupled to the plated through hole; the second conductive pad capable of being electrically connected to a third electrically conductive pad attached to a top of a second interconnectable circuit board, wherein when the second conductive pad is electrically connected to the third electrically conductive pad, the length of the interconnectable circuit board and the second interconnectable circuit board is greater than the individual length of the interconnectable circuit board and greater than the individual length of the second interconnectable circuit board.

16. The circuit board of claim 15, further comprising cut marks indicating safe locations for separating the circuit board.

17. The circuit board of claim 16, wherein circuit traces are reduced in an immediate area of the cut mark.

18. The circuit board of claim 17, further comprising a second cut mark adjacent to the first cut mark where the area between the first and second cut mark can be utilized to make a safe cut through the circuit board.

19. The circuit board of claim 18, wherein the circuit board can be cut with scissors.

20. The circuit board of claim 19, wherein the circuit board can be cut to any desired length, size and shape.

* * * * *